United States Patent
Tilton et al.

(10) Patent No.: US 10,827,247 B2
(45) Date of Patent: Nov. 3, 2020

(54) EARPHONE

(71) Applicant: Bose Corporation, Framingham, MA (US)

(72) Inventors: Abby Tilton, Waltham, MA (US); Richard Arthur Grebe, Stow, MA (US); Donna Marie Sullivan, Millbury, MA (US); Christopher Ratcliffe, Mendon, MA (US); Daniel H. Sargent, Wayland, MA (US)

(73) Assignee: Bose Corporation, Framingham, MA (US)

( * ) Notice: Subject to any disclaimer, the term of this patent is extended or adjusted under 35 U.S.C. 154(b) by 0 days.

(21) Appl. No.: 16/241,229

(22) Filed: Jan. 7, 2019

(65) Prior Publication Data

US 2020/0221203 A1    Jul. 9, 2020

(51) Int. Cl.

| | | |
|---|---|---|
| *G01J 5/02* | (2006.01) | |
| *H04R 1/10* | (2006.01) | |
| *G01J 1/04* | (2006.01) | |
| *G01J 1/42* | (2006.01) | |
| *H02J 7/00* | (2006.01) | |
| *H05K 5/00* | (2006.01) | |
| *B29C 45/14* | (2006.01) | |
| *B29K 55/02* | (2006.01) | |

(Continued)

(52) U.S. Cl.
CPC .......... *H04R 1/1016* (2013.01); *G01J 1/0411* (2013.01); *G01J 1/4204* (2013.01); *H02J 7/0045* (2013.01); *H04R 1/1025* (2013.01); *H04R 1/1058* (2013.01); *H05K 5/0004* (2013.01); *H05K 5/0086* (2013.01); *H05K 5/0091* (2013.01); *B29C 45/14336* (2013.01); *B29K 2055/02* (2013.01); *B29K 2069/00* (2013.01); *B29K 2669/00* (2013.01); *B29L 2031/3418* (2013.01)

(58) Field of Classification Search
CPC ... H04R 1/1016; H04R 1/1058; H02J 7/0045; H05K 5/0086; H05K 5/0091; H05K 5/0004; G01J 1/0411; G01J 1/4204; B29K 2055/02; B29K 2669/00; B29C 45/14336; B29L 2031/3418
See application file for complete search history.

(56) References Cited

U.S. PATENT DOCUMENTS

| | | | |
|---|---|---|---|
| 5,633,574 A | * | 5/1997 | Sage .................... H02J 7/00711 320/107 |
| 8,989,427 B2 | | 3/2015 | Silvestri et al. |

(Continued)

FOREIGN PATENT DOCUMENTS

WO    2013/170109 A1    11/2013

OTHER PUBLICATIONS

The International Search Report and the Written Opinion of the International Searching Authority dated Mar. 16, 2020 for PCT Application No. PCT/US2020/012536.

(Continued)

*Primary Examiner* — Kiho Kim
(74) *Attorney, Agent, or Firm* — Brian M. Dingman; Dingman IP Law, PC

(57) ABSTRACT

An earbud with a housing comprising a housing outer wall and an electromagnetic radiation-transmissive lens in the housing outer wall. The housing outer wall and the lens are co-molded.

20 Claims, 7 Drawing Sheets

(51) Int. Cl.
*B29K 69/00* (2006.01)
*B29K 669/00* (2006.01)
*B29L 31/34* (2006.01)

(56) References Cited

U.S. PATENT DOCUMENTS

| | | | |
|---|---|---|---|
| 9,794,653 B2* | 10/2017 | Aumer | G08B 21/18 |
| 9,854,345 B2 | 12/2017 | Briggs | |
| 2002/0008977 A1* | 1/2002 | Baumann | B60Q 1/0416 |
| | | | 362/546 |
| 2005/0259985 A1* | 11/2005 | Mulvey | G03B 17/08 |
| | | | 396/427 |
| 2005/0279940 A1* | 12/2005 | Everest | G01J 5/08 |
| | | | 250/338.1 |
| 2008/0070703 A1* | 3/2008 | Campo | G07F 17/3202 |
| | | | 463/46 |
| 2012/0225622 A1 | 9/2012 | Kudrna et al. | |
| 2015/0057548 A1* | 2/2015 | Kaufman | A61B 1/041 |
| | | | 600/473 |
| 2016/0219356 A1 | 7/2016 | Cheng | |
| 2016/0377828 A1* | 12/2016 | Ito | G02B 7/022 |
| | | | 359/819 |
| 2017/0188132 A1 | 6/2017 | Hirsch et al. | |
| 2018/0092601 A1 | 4/2018 | Wagner et al. | |

OTHER PUBLICATIONS

Anonymous: "Health Monitoring and Fitness Tracking—OSRAM Opto Semiconductors: Light is OSRAM"; Mar. 31, 2017 (Mar. 31, 2017), XP055674114; Retrieved from the Internet: https://web.archive.org/web/20170331195838/https://www.osram.com/os/applications/health-monitoring-and-fitness-tracking/index.jsp.

* cited by examiner

EARPHONE

BACKGROUND

This disclosure relates to an earphone.

Earphones can have infrared (IR) sensor(s) that can be used to detect daylight/nighttime conditions or proximity to a user's head or ear. Earphones can additionally or alternatively have a light emitting diode (LED) that can be used as part of the user interface (UI). In such cases the earphone housing needs to include an electromagnetic radiation-transmissive lens for each IR sensor or LED. The lenses act as a means to pass IR radiation into the housing or LED radiation out of the housing.

SUMMARY

All examples and features mentioned below can be combined in any technically possible way.

In one aspect, an earbud includes a housing comprising a housing outer wall, and an electromagnetic radiation-transmissive lens in the housing outer wall. The housing outer wall and the lens are co-molded.

Examples may include one of the above and/or below features, or any combination thereof. The housing outer wall and the lens may both be injection molded in the same molding tool. The lens may be molded before the housing outer wall is molded. The lens may be made from a polycarbonate material. The housing outer wall may be made from a polycarbonate and acrylonitrile butadiene styrene (ABS) material. The earbud may further comprise an infrared (IR) sensor in the housing and configured to sense IR radiation entering the housing through the lens. The earbud may further comprise a light emitting diode (LED) in the housing and configured to transmit visible light through the lens. The lens may have an outer surface that is exposed to an environment external to the earbud and an inner surface, and the inner and outer surfaces of the lens may be parallel.

Examples may include one of the above and/or below features, or any combination thereof. The earbud may comprise first and second electromagnetic radiation-transmissive lenses in the housing outer wall. The first lens may be configured to pass IR radiation into the housing and the second lens may be configured to transmit visible light out of the housing. Both the first and second lenses may be co-molded with the housing outer wall. The earbud may further comprise a third electromagnetic radiation-transmissive lens in the housing outer wall, wherein the third lens is configured to pass IR radiation into the housing, and the third lens is co-molded with the housing outer wall.

Examples may include one of the above and/or below features, or any combination thereof. The earbud may further comprise a pair of battery charging electrical contacts embedded in the housing outer wall. The battery charging electrical contacts may be insert molded into the housing outer wall. The battery charging electrical contacts may each comprise a narrow waist region bordered by two wider regions, wherein the waist region and two wider regions are embedded in the housing outer wall. The earbud may further comprise a magnet in the housing outer wall between the battery charging electrical contacts; the magnet may have an outer surface that is recessed below an outer surface of the battery charging electrical contacts. The magnet may be adhesively coupled into a recess in the housing outer wall.

In another aspect, an earbud includes a housing comprising a housing outer wall, first and second electromagnetic radiation-transmissive lenses in the housing outer wall, wherein the first lens is configured to pass IR radiation into the housing and the second lens is configured to transmit visible light out of the housing, wherein the housing outer wall and the lenses are co-molded, an infrared (IR) sensor in the housing and configured to sense IR radiation entering the housing through the first lens, and a light emitting diode (LED) in the housing and configured to transmit visible light through the second lens.

Examples may include one of the above and/or below features, or any combination thereof. The earbud may further comprise a pair of battery charger electrical contacts embedded in the housing outer wall, wherein the battery charging electrical contacts are insert molded into the housing outer wall. The battery charging electrical contacts may each comprise a narrow waist region bordered by two wider regions, wherein the waist region and two wider regions are embedded in the housing outer wall. The earbud may further comprise a magnet in the housing outer wall between the battery charging electrical contacts, wherein the magnet has an outer surface that is recessed below an outer surface of the battery charging electrical contacts. The magnet may be adhesively coupled into a recess in the housing outer wall.

DETAILED DESCRIPTION

Earphones with an IR sensor and/or an LED can also have an electromagnetic radiation-transmissive lens for each IR sensor or LED. The lenses need to be built into the earphone housing body and be directly exposed to both the inside and outside of the housing body. The lenses are typically separate parts that are coupled to the housing body by adhesive or by heat-staking. In both cases the housing body is molded with openings for the lenses. When the lenses are installed in the housing there can be a discontinuity between the housing body and the lens. This discontinuity can act as point of ingress of moisture or other contaminants that can have a negative impact on the earphone's performance. The discontinuity can also lead to potentially damaging electrostatic discharge (ESD). Moisture ingress and ESD can be avoided by co-molding the lenses and the housing body.

An earphone or a headphone refers to a device that typically fits around, on, in, or near an ear and that radiates acoustic energy into or towards the ear canal. Headphones and earphones are sometimes referred to as earpieces, headsets, earbuds, or sport headphones, and can be wired or wireless. An earphone includes an electro-acoustic transducer driver to transduce audio signals to acoustic energy. The acoustic driver may be housed in an earcup, earbud, or other housing. Some of the figures and descriptions following show a single earphone device. An earphone may be a single stand-alone unit or one of a pair of earphones (each including at least one acoustic driver), one for each ear. An earphone may be connected mechanically to another earphone, for example by a headband and/or by leads that conduct audio signals to an acoustic driver in the headphone. An earphone may include components for wirelessly receiving audio signals. An earphone may include components of an active noise reduction (ANR) system. Earphones may also include other functionality, such as a microphone. An earphone may also be an open-ear device that includes an electro-acoustic transducer to radiate acoustic energy towards the ear canal while leaving the ear open to its environment and surroundings.

In an around-the-ear, on-the-ear, or off-the-ear earphone, the earphone may include a headband and at least one housing that is arranged to sit on or over or proximate an ear of the user. The headband can be collapsible or foldable, and can be made of multiple parts. Some headbands include a slider, which may be positioned internal to the headband, that provides for any desired translation of the housing. Some earphones include a yoke pivotally mounted to the headband, with the housing pivotally mounted to the yoke, to provide for any desired rotation of the housing.

Figure 1:
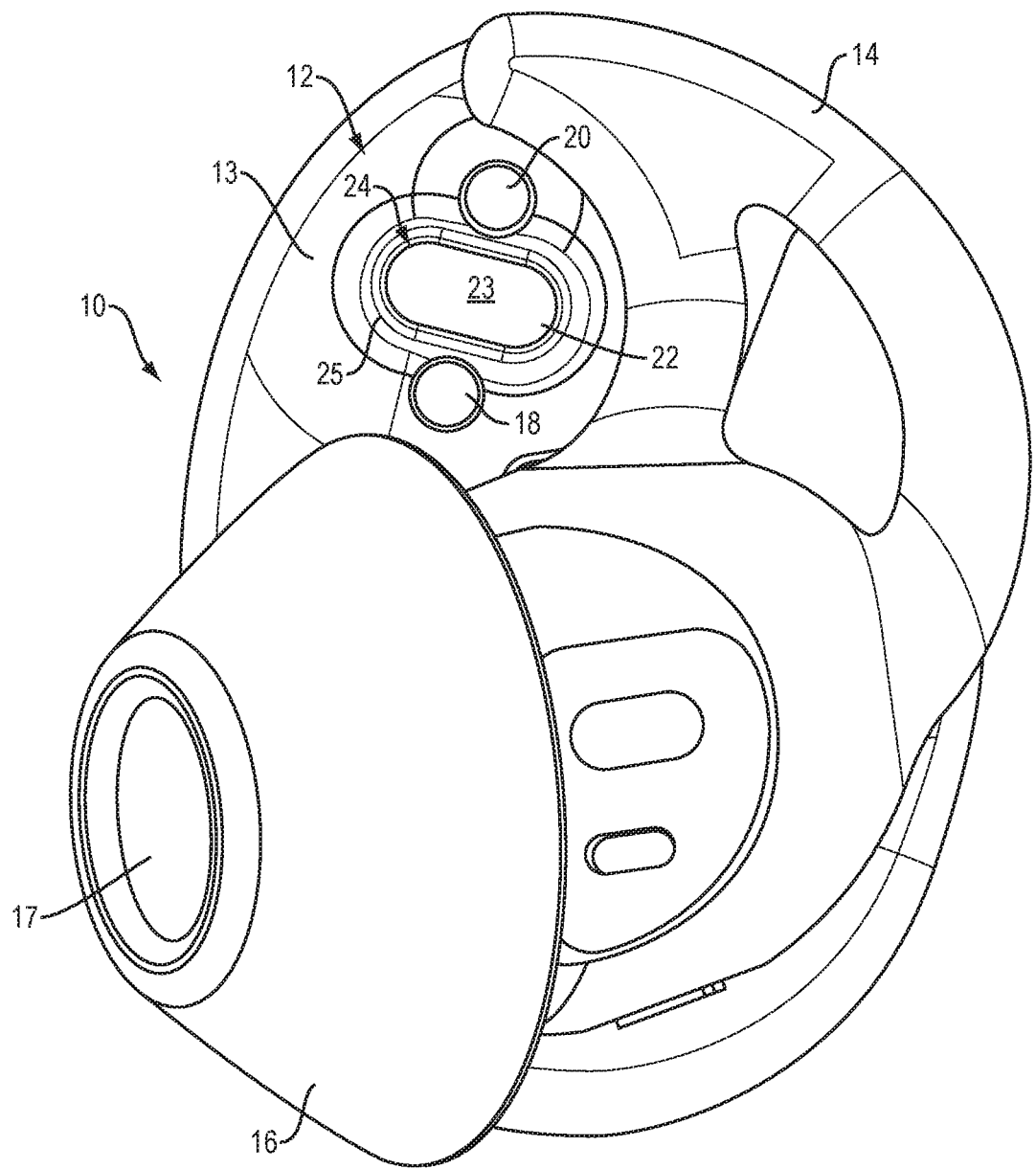
FIG. 1 is a top view of an earbud.

FIG. 1 is a perspective view of in-ear headphone, earphone, or earbud 10. In this non-limiting example earbud 10 is fully wireless and is configured to be carried on the outer ear, with sound provided directly into the ear canal. Earphone 10 includes body 12 that is a molded plastic enclosure that can be made from one, two, three or more separate molded parts. Body 12 houses the active components of the earbud. Ear tip portion 16 is coupled to body 12 and is pliable so that it can be inserted into at least the entrance of the user's ear canal. Sound is delivered through opening 17. Retaining loop 14 is constructed and arranged to be positioned in the outer ear, for example in the antihelix, to help retain the earbud in the ear. Earphones and earbuds are well known in the field (e.g., as disclosed in U.S. Pat. Nos. 9,854,345 and 8,989,427, the disclosures of which are incorporated herein by reference in their entirety and for all purposes), and so certain details of the earbud are not further described herein. An earbud is an example of an earphone according to this disclosure, but is not limiting of the scope, as earphones can also be located on or over the ear, or even on the head near the ear.

The battery (not shown) in earbud 10 is charged via charging contacts 18 and 20, as is known in the art. A docking magnet 22 can be used to magnetically couple earbud 10 to a battery charging device (not shown) such that charging contacts 18 and 20 make an electrical connection with the corresponding charging contacts of the battery charging device. Docking magnet 22 can be located between contacts 18 and 20 to help the docking magnet to more uniformly pull contacts 18 and 20 into the corresponding contacts of the battery charging device. In the present instance, the top surface 23 of docking magnet 22 is located below surface 13 of earbud body or housing 12. Housing cavity 24, located above docking magnet upper exposed surface 23, can help to guide a corresponding docking magnet of the charging device into proper mating contact with magnet 22. Proper alignment and mating of the magnets can be facilitated by creating a chamfer 25 at the opening to cavity 24.

Figure 2A:
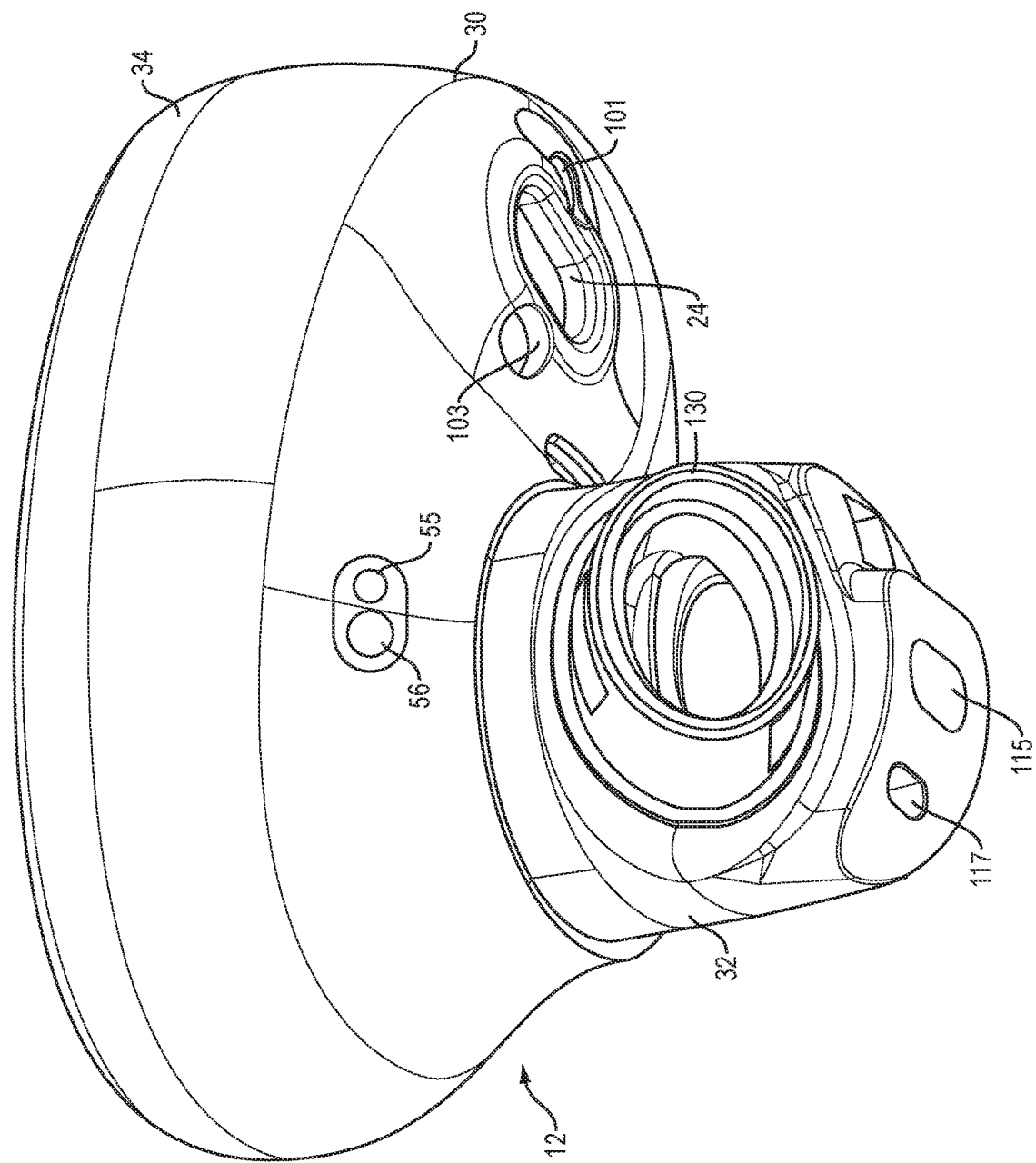
FIG. 2A is a bottom perspective view of the body of the earbud of FIG. 1.

FIG. 2A is a bottom perspective view of earbud body 12 that comprises housing portion 30, front cavity portion 32, and upper portion 34. The three portions can be molded separately and then coupled together in a desired fashion (e.g., using an adhesive), typically but not necessarily after the internal components are added. Front cavity portion 32 comprises nozzle 130 which is configured to conduct sound to opening 17. Front cavity portion 32 also includes openings 115 and 117. Opening 117 can be for a pressure equalization port of a type known in the field, and would typically be an acoustic port covered by a resistive mesh material. Opening 115 can be for an IR lens for an IR sensor. Housing portion 30 comprises cavity 24 for docking magnet 22, and openings 103 and 101 for battery charging contacts 18 and 20. Openings 55 and 56 can be for an IR sensor; one can be for an IR emitter and one for an IR sensor. Both would typically be covered by an IR lens.

Figure 2B:
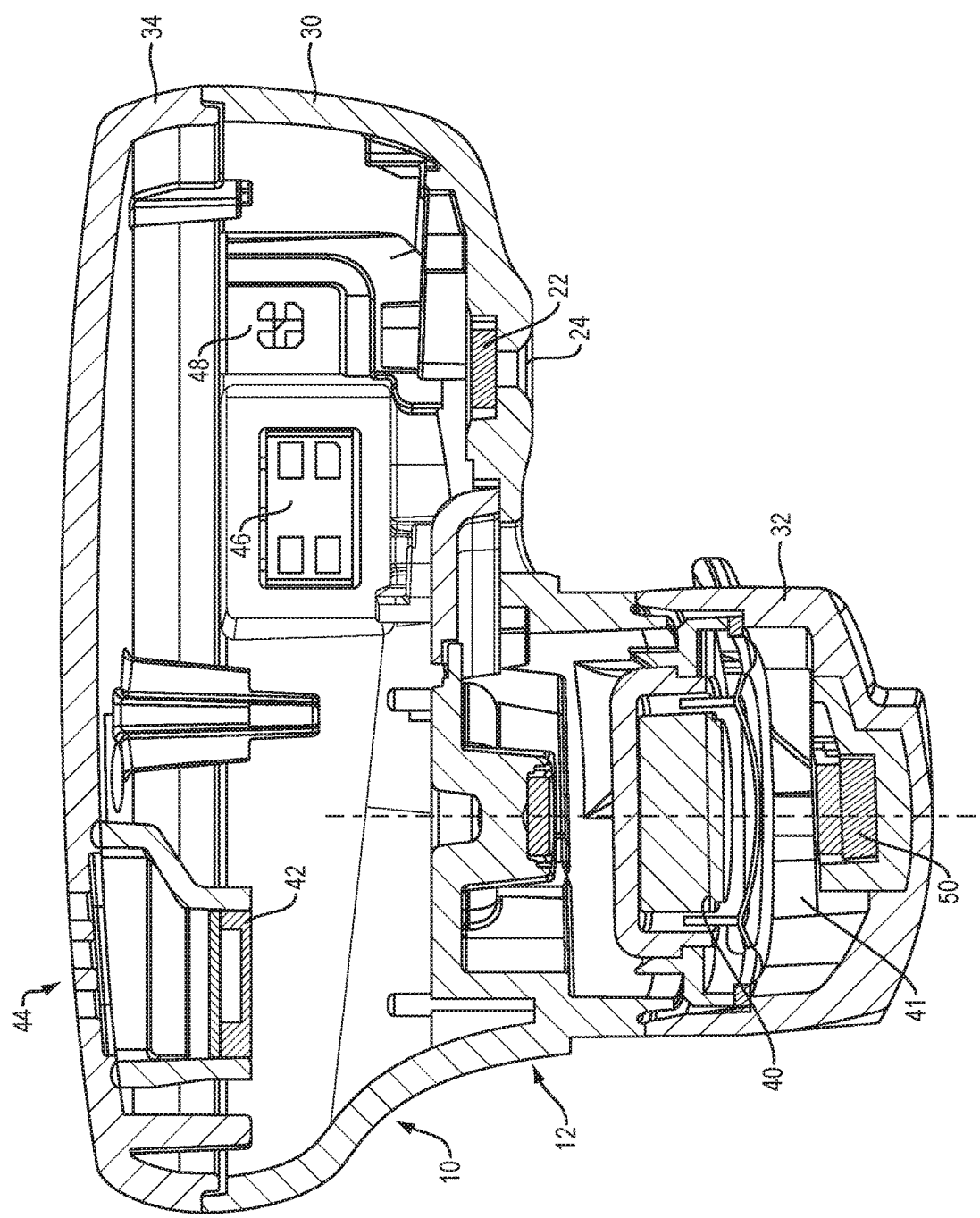
FIG. 2B is a partial cross-sectional view of the earbud of FIG. 1.

FIG. 2B is a partial cross-sectional view of earbud 10; note that FIG. 2B does not include all of the components that may be in body 12, simply for the sake of clarity of illustration. Electro-acoustic transducer 40 is configured to deliver sound into front cavity 41, which leads to nozzle 130. Microphone 42 is configured to pick up sound entering through openings 44, and can be used for earbud microphone functionality, as is known in the field. IR sensor 50 is configured to point directly at the concha and so can be used as a proximity sensor to detect when earbud 10 is inserted into the ear. Second IR sensor 46 is configured to point toward the tragus. The IR sensors can be used for non-contact distance sensing (i.e., proximity sensing), which can be used to enable or disable functionalities, as is known in the field. The IR sensors can alternatively or additionally be used for ambient light sensing, which can also be used to enable or disable functionalities, as is known in the field. LED 48 can be part of the earbud UI, as is known in the field. Docking magnet 22 can be glued into cavity 24.

Each of the IR sensors and the LED is an electromagnetic radiation sensor or emitter. Since the IR sensor(s) and/or the LED are located inside of body 12, the earbud needs to include an electromagnetic transmissive lens or window that can pass the wavelength(s) being transmitted to/from the sensor or LED. In most earbuds, the necessary electromagnetic transmissive lens(es)/window(s) are plastic parts that are made separately from the earphone body and either glued or heat-staked into an opening in the earbud body. The openings are not always completely sealed by the adhesive or heat staking, and so can act as points of ingress of moisture or other contaminants that can have a negative impact on the earphone's performance. Also, gaps between the lenses and the housing can lead to electrostatic discharge (ESD), which can cause damage to sensitive electronic devices in the earbud, or external to it.

In the present disclosure the necessary electromagnetic transmissive lens(es)/window(s) for the IR sensor(s) and/or the LED(s) (or other electromagnetic spectrum emitters or sensors that are present in the earbud) are co-molded with the portion of the earbud body 12 in which they are located. Co-molding involves sequentially molding the body portion and the lens(es) in the same mold tooling, such that the two become parts of a unitary molded plastic part. The body portion and the lens(es) are typically made of different materials. In one non-limiting example, the body is made from an acrylonitrile butadiene styrene (ABS)/polycarbonate (PC) blend material, and the lens(es) are made from a PC material, although either or both could be made of other plastic materials that can be co-molded. In one non-limiting example the lens(es) are molded first (and of a material that passes the wavelengths of interest), the core is rotated into a different cavity, and the body is then molded such that it encapsulates at least the peripheries of the lenses, but leaving the lens material exposed both on the outside and inside of the body. Alternatively, the body can be molded first and then the lenses can be molded into openings in the body. Exemplary configurations of co-molded lenses and earbud body portions are shown in FIGS. 3A-3C and FIG. 4.

With co-molded lenses and body portions, the lenses and body are integral parts of a unitary whole apparatus comprising the lenses and the body. There are no gaps or crevices between the lenses and the body that can lead to moisture-related degradation or ESD. Also, the co-molded parts are uniform and so require less or no post-molding operations (such as gluing in the lenses or heat staking the lenses, or removing excess adhesive or excess housing material that was displaced due to the heat staking operation). Also, since the lenses do not need to be handled in any manner during their coupling to the earbud body, they cannot be damaged or altered by post-molding operations. This makes the lenses more consistent from one earbud to another. It also leads to increased production yield. In sum, co-molding of the lenses and the earbud body portions reduces manufacturing time, effort and risk, and results in lower manufacturing costs. Craftsmanship is improved because gaps between the lenses and the body are eliminated.

Figure 3A:
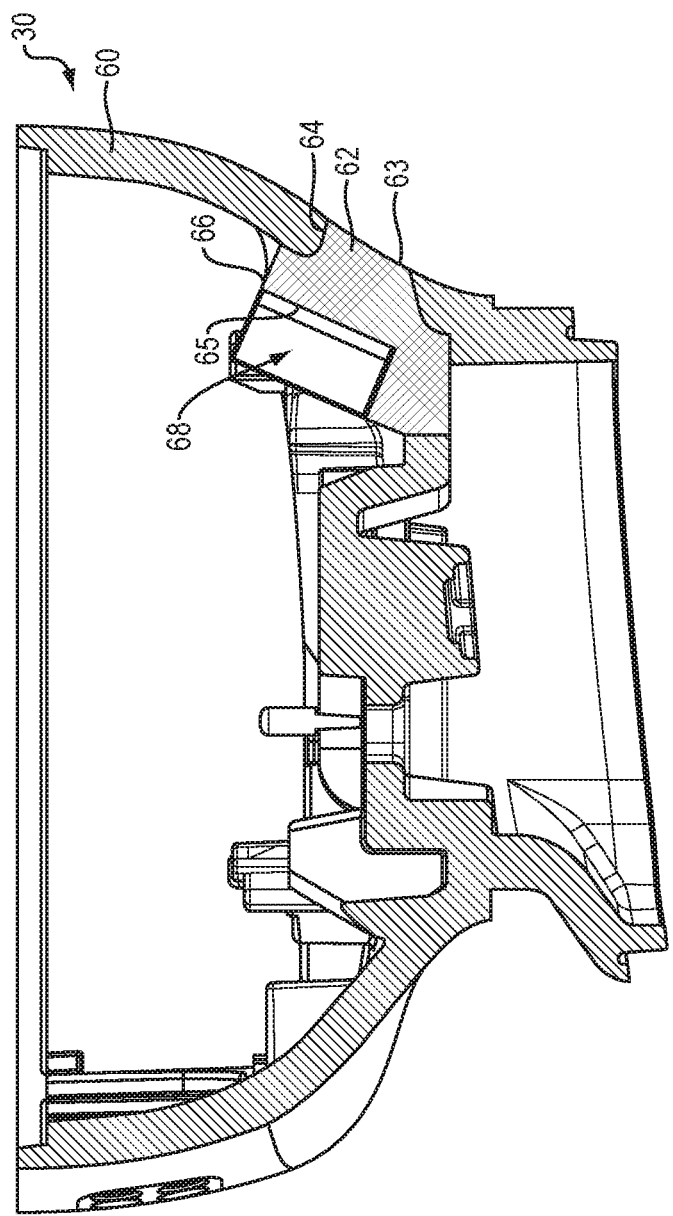
FIG. 3A is a cross-sectional view of the housing of the earbud of FIGS. 1, 2A, and 2B.

FIG. 3A is a first cross-sectional view of housing 30, illustrating IR lens 62 that is co-molded with housing portion 30 that comprise outer wall 60. Lens 62 comprises outer surface 63 that is exposed to the environment external to the earbud, and internal section 66 that overlays adjacent parts of housing wall 60. Narrowed region 64 helps to keep lens 62 fully embedded in wall 60. Opening or slot 68 is defined at or proximate the inner portion of lens 62 and is configured to hold or interface with an IR sensor (e.g., sensor 46) such that it can sense IR radiation entering through lens 62. The IR sensor sits very close to lens inner wall 65. As depicted, inner wall 65 can be parallel to lens outer surface 62, which leads to less refraction of the IR radiation as it passes from the outside to the IR sensor. By parallel we mean exactly or essentially parallel, within tolerances of design and manufacturing of lenses. The lens can be configured in other fashions to refract the electromagnetic radiation in a desired fashion, depending on the earbud design and use, as would be apparent to those skilled in the technical field.

Figure 3B:
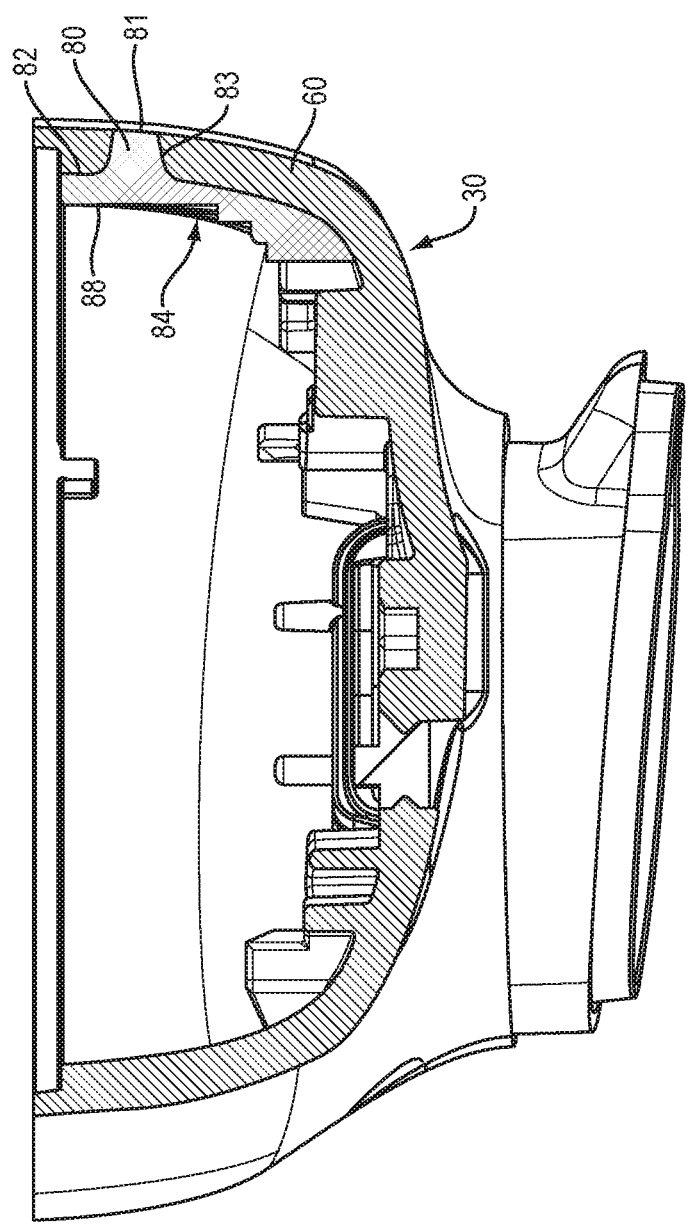
FIG. 3B is another cross-sectional view of the housing of FIG. 3A.

FIG. 3B is a different cross-sectional view of housing 30, illustrating LED lens 80 that is co-molded with housing portion 30 that comprises outer wall 60. Lens 80 comprises outer surface 81 that is exposed to the environment external to the earbud, and internal section 82 that overlays adjacent parts of wall 60. Narrowed region 83 helps to keep lens 80 fully embedded in wall 60. Opening or slot 84 is defined at the inner portion of lens 80 and is configured to hold or interface with an LED (e.g., LED 48) such that the LED can transmit light through lens 80 to the environment outside of the earbud. The LED sits very close to lens inner wall 88. As depicted, inner wall 88 can be parallel or essentially parallel to lens outer surface 81, which leads to less refraction of the light as it passes from inside the earbud to the outside environment. The lens can be configured in other fashions to refract the electromagnetic radiation in a desired fashion, depending on the earbud design and use, as would be apparent to those skilled in the technical field. Lens 80 desirably may diffuse the light so that the LED does not appear to be a point source. Light diffusion can be accomplished using either a milky plastic material or with a separate diffusing layer that is adhered to the inside surface 88 of lens 80.

Figure 3C:
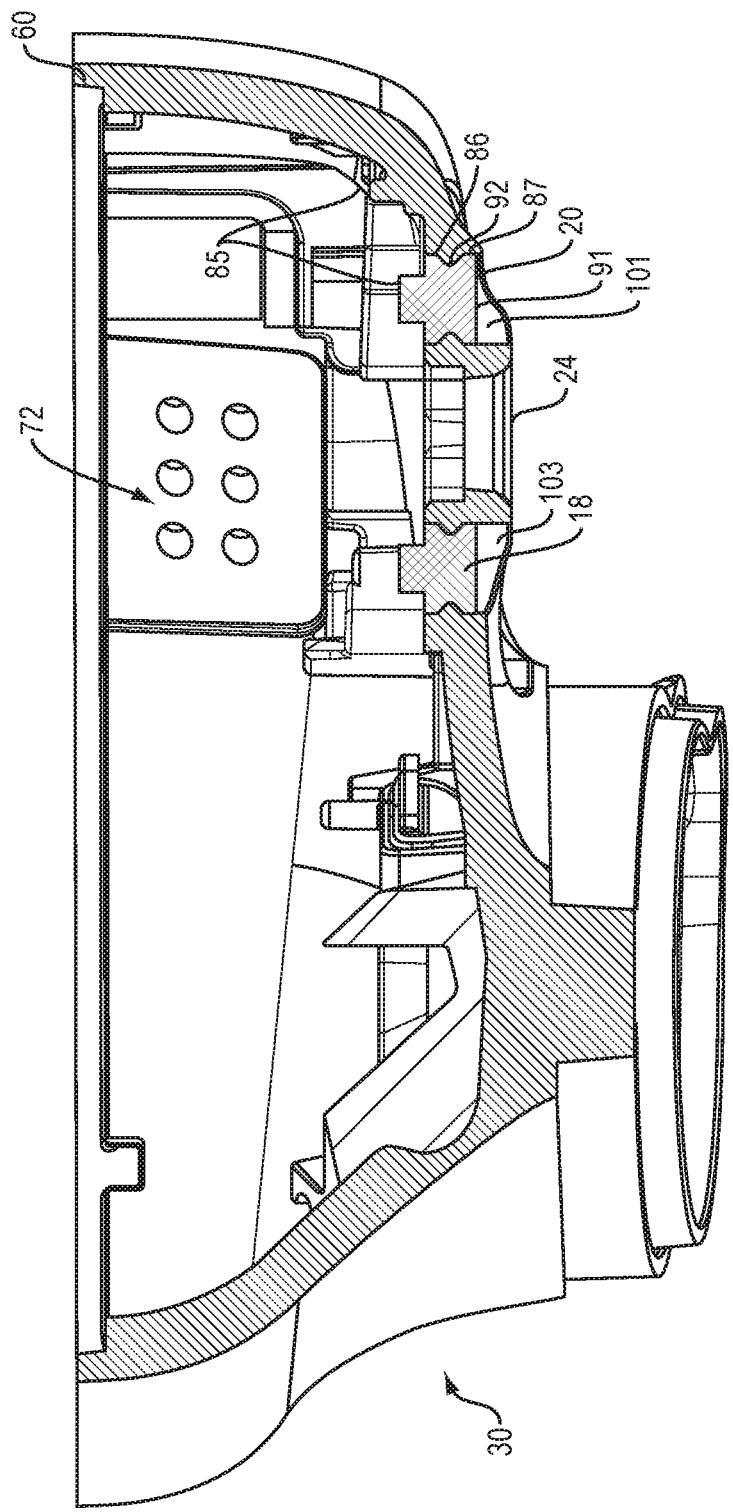
FIG. 3C is another cross-sectional view of the housing of FIGS. 3A and 3B.

FIG. 3C is a different cross-sectional view of housing 30, illustrating contacts 18 and 20 that are used to electrically connect to a battery charging device (not shown) that can be used to recharge the battery (not shown) carried in earbud 10. Rechargeable earbud batteries are known in the field and so are not further described. Also shown are sidewall openings 72 that conduct sound pressure to a microphone (not shown). Contact 20 comprises a narrowed waist region 92 that is bordered on one or two sides by wider region(s) 86 and/or 87. Regions 86, 87, and 92 are embedded in outer wall 60 of housing 30. Inner region 85 can be used to connect wiring that passes charging current to the battery. Second contact 18 is identical to contact 20. Contacts 18 and 20 are preferably but not necessarily embedded in wall 60 by insert molding. Contacts 18 and 20 can be placed into the mold tool after the first shot wherein the lenses are formed, and before the second shot wherein sidewall 60 is formed.

Figure 4:
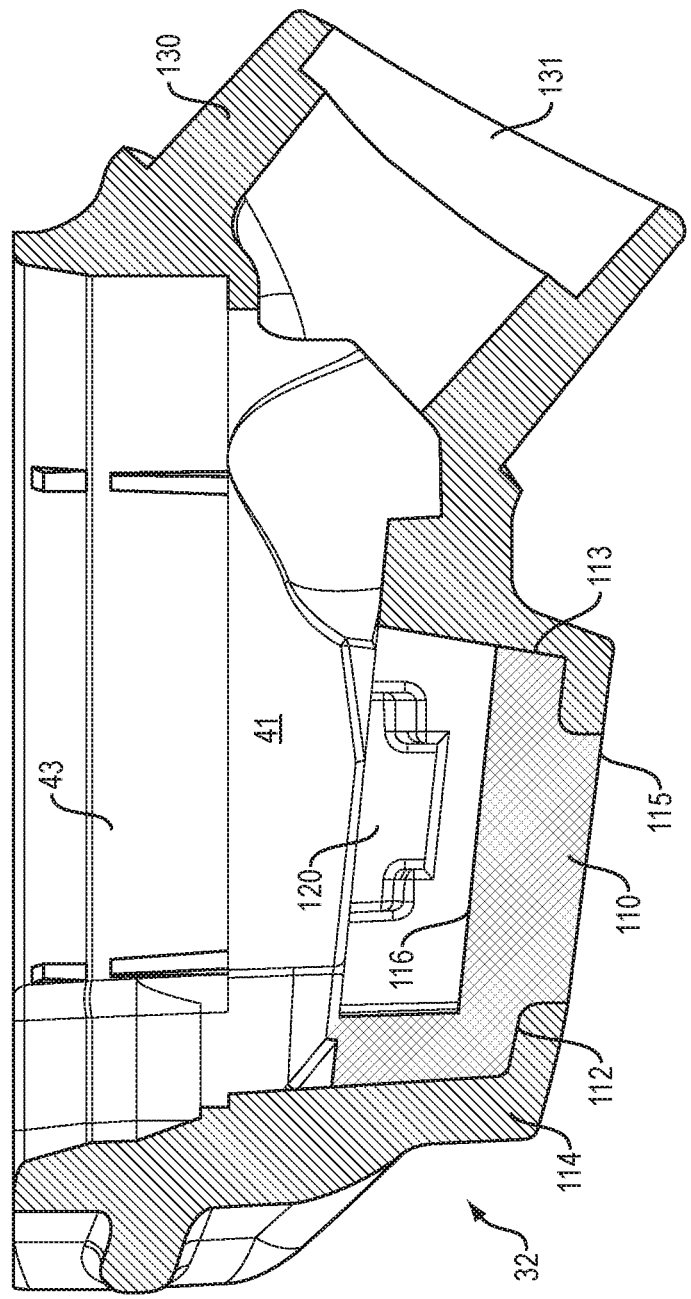
FIG. 4 is a cross-sectional view of the front cavity portion of the earbud of FIGS. 1, 2A, and 2B.

FIG. 4 is a cross-sectional view of front cavity portion 32 of earbud 10, illustrating IR lens 110 that is co-molded with front cavity portion 32 that comprise outer wall 114. Lens 110 comprises outer surface 115 that is exposed to the environment external to the earbud, and internal section 113 that overlays adjacent parts of wall 114. Narrowed region 112 helps to keep lens 110 fully embedded in wall 114. Opening or slot 120 is located adjacent the inner portion of lens 110 and is configured to hold or interface with an IR sensor (e.g., sensor 50) such that it can sense IR radiation entering through lens 110. The IR sensor can be configured to sit very close to lens inner wall 116. As depicted, inner wall 116 can be essentially parallel to lens outer surface 115, which leads to less refraction of the IR radiation as it passes from the outside to the IR sensor. The lens can be configured in other fashions to refract the electromagnetic radiation in a desired fashion, depending on the earbud design and use, as would be apparent to those skilled in the technical field. Also illustrated is cavity 43 for transducer 40, and nozzle 130 that is acoustically coupled to transducer front acoustic cavity 41. Nozzle 130 has outlet 131 that leads to opening 17 (FIG. 1).

A number of implementations have been described. Nevertheless, it will be understood that additional modifications may be made without departing from the scope of the inventive concepts described herein, and, accordingly, other examples are within the scope of the following claims.

What is claimed is:

1. An earbud, comprising:
   a housing comprising a housing outer wall; and
   an electromagnetic radiation-transmissive lens in the housing outer wall;
   wherein the housing outer wall and the lens are co-molded, and wherein the lens has an outer surface that is exposed to an environment external to the earbud and an inner surface at a substantially opposite side of the lens from the outer surface, and wherein the inner and outer surfaces of the lens are essentially parallel.

2. The earbud of claim 1, wherein the housing outer wall and the lens are both injection molded in the same molding tool.

3. The earbud of claim 2, wherein the lens is molded before the housing outer wall is molded.

4. The earbud of claim 1, wherein the lens is made from a polycarbonate material.

5. The earbud of claim 1, wherein the housing outer wall is made from a polycarbonate and acrylonitrile butadiene styrene (ABS) material.

6. The earbud of claim 1, further comprising an infrared (IR) sensor in the housing and configured to sense IR radiation entering the housing through the lens.

7. The earbud of claim 1, further comprising a light emitting diode (LED) in the housing and configured to transmit visible light through the lens.

8. The earbud of claim 1, comprising first and second electromagnetic radiation- transmissive lenses in the housing outer wall, wherein the first lens is configured to pass IR radiation into the housing and the second lens is configured to transmit visible light out of the housing, and both the first and second lenses are co-molded with the housing outer wall.

9. The earbud of claim 8, further comprising a third electromagnetic radiation-transmissive lens in the housing outer wall, wherein the third lens is configured to pass IR radiation into the housing, and the third lens is co-molded with the housing outer wall.

10. The earbud of claim 1, further comprising a pair of battery charging electrical contacts embedded in the housing outer wall.

11. The earbud of claim 10, wherein the battery charging electrical contacts are insert molded into the housing outer wall.

12. The earbud of claim 11, wherein the battery charging electrical contacts each comprise a narrow waist region bordered by two wider regions, wherein the waist region and two wider regions are embedded in the housing outer wall.

13. The earbud of claim 10, further comprising a magnet in the housing outer wall between the battery charging electrical contacts.

14. The earbud of claim 13, wherein the magnet has an outer surface that is recessed below an outer surface of the battery charging electrical contacts.

15. The earbud of claim 13, wherein the magnet is adhesively coupled into a recess in the housing outer wall.

16. An earbud, comprising:
a housing comprising a housing outer wall;
first and second electromagnetic radiation-transmissive lenses in the housing outer wall, wherein the first lens is configured to pass IR radiation into the housing and the second lens is configured to transmit visible light out of the housing, wherein the housing outer wall and the lenses are co-molded;
an infrared (IR) sensor in the housing and configured to sense IR radiation entering the housing through the first lens; and
a light emitting diode (LED) in the housing and configured to transmit visible light through the second lens, wherein at least one of the lenses has an outer surface that is exposed to an environment external to the earbud and an inner surface at a substantially opposite side of the lens from the outer surface, and wherein the inner and outer surfaces of the lens are essentially parallel.

17. The earbud of claim 16, further comprising a pair of battery charger electrical contacts embedded in the housing outer wall, wherein the battery charging electrical contacts are insert molded into the housing outer wall.

18. The earbud of claim 17, wherein the battery charging electrical contacts each comprise a narrow waist region bordered by two wider regions, wherein the waist region and two wider regions are embedded in the housing outer wall.

19. The earbud of claim 17, further comprising a magnet in the housing outer wall between the battery charging electrical contacts, wherein the magnet has an outer surface that is recessed below an outer surface of the battery charging electrical contacts.

20. The earbud of claim 19, wherein the magnet is adhesively coupled into a recess in the housing outer wall.

\* \* \* \* \*